US012159772B2

(12) United States Patent
Pankratz et al.

(10) Patent No.: US 12,159,772 B2
(45) Date of Patent: Dec. 3, 2024

(54) APPARATUS, SYSTEM AND METHOD TO REDUCE CRAZING

(71) Applicant: Advanced Energy Industries, Inc., Fort Collins, CO (US)

(72) Inventors: Joshua B. Pankratz, Fort Collins, CO (US); Douglas R. Pelleymounter, Grand Rapids, MN (US); Uwe Krause, Dresden (DE)

(73) Assignee: Advanced Energy Industries, Inc., Denver, CO (US)

( * ) Notice: Subject to any disclaimer, the term of this patent is extended or adjusted under 35 U.S.C. 154(b) by 471 days.

(21) Appl. No.: 16/399,819

(22) Filed: Apr. 30, 2019

(65) Prior Publication Data

US 2019/0341235 A1 Nov. 7, 2019

Related U.S. Application Data

(60) Provisional application No. 62/667,569, filed on May 6, 2018.

(51) Int. Cl.
 *H01J 37/32* (2006.01)
 *C23C 14/56* (2006.01)

(52) U.S. Cl.
 CPC ...... *H01J 37/32899* (2013.01); *C23C 14/568* (2013.01); *H01J 37/32064* (2013.01); *H01J 37/32733* (2013.01)

(58) Field of Classification Search
 USPC ..................................... 156/345.28; 118/715
 See application file for complete search history.

(56) References Cited

U.S. PATENT DOCUMENTS

| 5,287,008 | A | * | 2/1994 | Pahr | H02H 9/005 |
| | | | | | 361/679.01 |
| 5,415,757 | A | * | 5/1995 | Szcyrbowski | C23C 14/0036 |
| | | | | | 204/192.12 |
| 5,807,470 | A | * | 9/1998 | Szczyrbowski | H05H 1/46 |
| | | | | | 204/298.08 |

(Continued)

FOREIGN PATENT DOCUMENTS

| CN | 1155748 A | 7/1997 |
| JP | 4-233616 | 8/1992 |

(Continued)

OTHER PUBLICATIONS

International Searching Authority, International Search Report and Written Opinion, issued for International Application No. PCT/US2019/030056, mailed Jul. 11, 2019 (14 pages).

(Continued)

*Primary Examiner* — Ram N Kackar
(74) *Attorney, Agent, or Firm* — Neugeboren O'Dowd PC (57) ABSTRACT

A coating system that reduces parasitic currents that may cause crazing in coatings on a substrate. In one example, the system includes a pair of low impedance shunt paths to ground for parasitic AC currents generated from the plasma in the chamber. The low impedance shunts may be provided through a balanced triaxial connection between a power supply of each chamber and the magnetrons of each chamber. In another example, potential differences between adjacent chambers are minimized through synchronized power supply signals between chambers.

20 Claims, 9 Drawing Sheets

(56) References Cited

U.S. PATENT DOCUMENTS

| | | | | |
|---|---|---|---|---|
| 6,347,043 | B1* | 2/2002 | Natarajan | H05K 9/0064 |
| | | | | 361/801 |
| 8,467,211 | B2 | 6/2013 | Horishita et al. | |
| 9,103,026 | B1* | 8/2015 | Dorn | C23C 14/35 |
| 2005/0098337 | A1* | 5/2005 | Brock | H01R 9/2483 |
| | | | | 174/51 |
| 2010/0118927 | A1* | 5/2010 | Ichimura | H04L 5/1423 |
| | | | | 370/464 |
| 2013/0313108 | A1 | 11/2013 | Yoshida | |
| 2015/0109716 | A1* | 4/2015 | Konno | H01J 37/32724 |
| | | | | 361/234 |
| 2018/0040461 | A1 | 2/2018 | Pankratz et al. | |

FOREIGN PATENT DOCUMENTS

| | | |
|---|---|---|
| JP | 2017-50508 | 3/2017 |
| JP | 2018063167 | 4/2018 |

OTHER PUBLICATIONS

Hochstrasser, M., Communication Pursuant to Article 94(3) EPC re: EP20190723614, European Patent Office, Jun. 13, 2022.
Third Party Observation for Application No. EP20190723614, European Patent Office, Apr. 13, 2022.
Hochstrasser, M, Communication Pursuent to Article 94(3) EPC re: EP20190723614, European Patent Office, Sep. 6, 2022.
Official Letter Search Report of Taiwan Patent Application No. 108115385, Taiwan Patent Office, Dec. 15, 2022.
Official Japanese Action, Mar. 30, 2023, Japanese Patent Office, Japan.
Official Taiwanese Action, May 16, 2023, Taiwanese Patent Office, Taiwan.
Ichiro Yamamoto, Japanese Office Action, Notice of Reasons For Rejection, Sep. 22, 2023, Patent Application 2020-561921.
CNIPA, Office Action issued in CN Application No. 201980030803. 2, Sep. 12, 2023, pp. 16.

* cited by examiner

APPARATUS, SYSTEM AND METHOD TO REDUCE CRAZING

CROSS-REFERENCE TO RELATED APPLICATION

This application is related to and claims priority under 35 U.S.C. § 119(e) from U.S. Patent Application No. 62/667,569, filed May 6, 2018 entitled "Apparatus, System and Method to Reduce Crazing," the entire contents of which is incorporated herein by reference for all purposes.

TECHNICAL FIELD

Aspects of the present disclosure involve a coating system that reduces parasitic currents in a substrate being coated and thereby reduces conditions that cause crazing in the substrate.

BACKGROUND

Glass sheets can be coated with layers of metal and dielectric-containing films to vary the optical properties of the coated glass sheets. In many instances, glass is coated with films that are transparent to visible wavelengths but may block or reduce other wavelengths. Such films may reduce heat transfer and are useful in architectural glass and automotive glass, among others.

Glass coatings, particularly in large scales, are often applied in plasma chambers and the glass slab being coated moves, such as with a conveyor belt, between chambers where various layers are deposited on the glass. Some large scale glass coaters can be 200-300 feet in length and have 15-30 plasma chambers or more. Each deposition chamber can include one or more sputtering targets and a power supply such that as the glass passes through each chamber, a different thin film layer is deposited. Given a series of dozens of chambers, a sheet of glass can be quickly and homogeneously coated with dozens of thin film layers. Similar processes may be used with other substrates besides glass.

Figure 1:
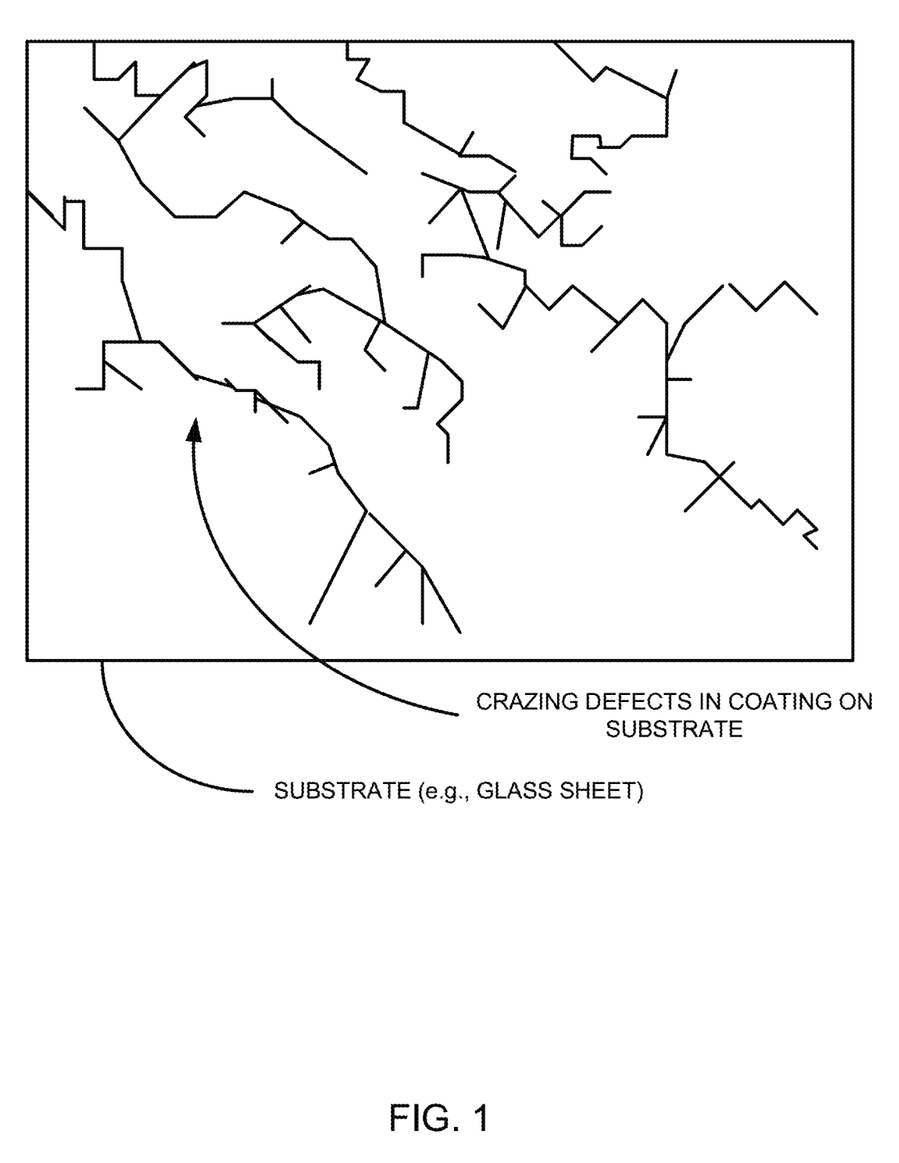
FIG. 1 is a representative diagram of a glass substrate with crazing in a coating thereon.

In some cases, crazing (sometimes referred to as "lightning arc defects") near the edges of the deposited layer may occur. FIG. 1 is a representative image of a crazing effect. Crazing involves a visible defect in the coatings that appears similar to a lightning strike and hence the reference to "lightning arc defect." Crazing, when significant or extending away from the edges, may ruin a slab of glass rendering it unusable, and hence reducing or eliminating crazing is an ongoing challenge in the industry.

It is with these observations in mind, among others, that aspects of the present disclosure were conceived.

SUMMARY

According to one embodiment, a deposition system comprises an alternating current power supply including a first output and a second output. The system further comprises a first grounded triaxial cable that comprises a first center conductor and a first conductive shield. In one example, the first triaxial cable includes an outer conductive shield that is connected to system ground to provide the grounded cable. The system further comprises a second grounded triaxial cable that comprises a second center conductor and a second conductive shield. In one example, the second triaxial cable includes an outer conductive shield that is connected to system ground to provide the grounded cable. The system further includes a deposition chamber having a first terminal and a second terminal. The first output, of the power supply, is coupled with the first center conductor and the second output, of the power supply, is coupled with the first conductive shield. The first output, of the power supply, is coupled with the second conductive shield and the second output, of the power supply, is coupled with the second center conductor. The first center conductor is coupled with the first terminal and the second inner conductive shield is coupled with the first terminal. Finally, the first inner conductive shield is coupled with the second terminal and the second center conductor is coupled with the second terminal. In one specific implementation, the deposition system is a glass coating system, and the first triaxial cable and the second triaxial cable provide capacitive or low impedance paths to ground for parasitic current otherwise causing defects on a substrate being processed in the glass coating system.

According to another embodiment, a deposition system comprises a power supply including a first output and a second output. The system further comprises a first conductive assembly comprising a first conductor coupled with a first terminal of a plasma deposition chamber configured to coat a substrate, and a second conductive assembly comprising a second conductor coupled with a second terminal of the plasma deposition chamber. An impedance element is coupled between the first terminal and ground and between the second terminal and ground, the impedance element providing a shunt path to ground for parasitic currents away from the substrate to reduce defect generation.

According to another embodiment, a deposition system comprises a first deposition chamber including a first terminal and a second terminal. A first power supply is coupled with the first terminal and the second terminal. A second deposition chamber includes a third terminal and a fourth terminal, with a second power supply coupled with the third terminal and the fourth terminal. A conveyor system moves a substrate between the first deposition chamber and the second deposition chamber, with the first deposition chamber positioned adjacent to the second deposition chamber. The first power supply provides a first alternating current signal to the first terminal and the second terminal is coordinated with the second power supply providing a second alternating current signal to the third terminal and the fourth terminal, the coordination to minimize a potential difference between at least the second terminal of the first deposition chamber and the third terminal of the second deposition chamber.

In another example embodiment, a deposition system comprises a first deposition chamber including a first terminal and a second terminal coupled with a first power supply, and a second deposition chamber including a third terminal and a fourth terminal coupled with a second power supply. The second deposition chamber is positioned adjacent to the first deposition chamber and the system includes a conveyance system for moving a substrate between the first deposition chamber and the second deposition chamber to process the substrate. The second terminal of the first deposition chamber is proximate the third terminal of the second deposition chamber wherein the first power supply is configured to provide an AC power signal to the second terminal synchronized with the second power supply providing a second AC power signal to the third terminal so that a first polarity of the first AC signal at the second terminal is the same as a second polarity of the second AC signal at the third terminal at the same time.

Aspects of the present disclosure may also involve a method comprising, in a system with a first AC signal driving a plasma coating process of a substrate in a first chamber and a second AC signal driving a plasma coating process of the same substrate in a second chamber where the first chamber is adjacent the second chamber, controlling the first AC signal and the second AC signal to minimize a potential difference across the substrate or potential plasma to plasma interactions and between the first chamber and the second chamber.

In another example, a deposition system comprises an alternating current power supply including a first output and a second output. The system includes a first triaxial cable that is grounded where the first triaxial cable comprises a first center conductor and a first conductive shield. The system further comprises a second triaxial cable that is grounded where the second triaxial cable comprises a second center conductor and a second conductive shield. The system further comprises a deposition chamber having a first terminal and a second terminal where the first output is coupled with the first center conductor and the second output coupled with the first conductive shield. The first output is coupled with the second conductive shield and the second output is coupled with the second center conductor. The first center conductor is coupled with the first terminal and the second inner conductive shield is coupled with the first terminal. The first inner conductive shield is coupled with the second terminal and the second center conductor coupled with the second terminal.

In yet another example, a deposition system comprises a power supply including a first output coupled with a first terminal of a deposition chamber providing a first conductive path. The power supply further includes a second output coupled with a second terminal of the deposition chamber providing a second conductive path. The deposition chamber processes a substrate. The system further includes an impedance element between the first conductive path and ground and between the second conductive path and ground wherein the impedance element provides a balanced shunt path for parasitic currents to ground and away from the substrate.

In yet another example, a deposition system comprises a first deposition chamber including a first terminal and a second terminal coupled with a first power supply. The system further includes a a second deposition chamber including a third terminal and a fourth terminal coupled with a second power supply, the second deposition chamber positioned adjacent to the first deposition chamber and including a conveyance system for moving a substrate between the first deposition chamber and the second deposition chamber to process the substrate. The second terminal of the first deposition chamber is proximate the third terminal of the second deposition chamber wherein the first power supply is configured to provide an AC power signal to the second terminal synchronized with the second power supply providing a second AC power signal to the third terminal so that a first polarity of the first AC signal at the second terminal is the same as a second polarity of the second AC signal at the third terminal at the same time.

In another example, a method comprises, in a system with a first AC signal driving a plasma coating process of a substrate in a first chamber and a second AC signal driving a plasma coating process of the same substrate in a second chamber where the first chamber is adjacent the second chamber, controlling the first AC signal and the second AC signal to minimize at least one of a potential difference across the substrate, a potential difference between the first chamber and the second chamber, and a potential difference from a plasma in the first chamber and a plasma in the second chamber.

These and other aspects of the present disclosure are described further below.

DETAILED DESCRIPTION

Some aspects of the present disclosure may be understood by the recognition of a new understanding represented by new models of deposition systems used in substrate coatings, and how those models can be used to identify possible causes of crazing. Conventionally, crazing has been understood to be initiated by an electrostatic discharge. The discharge is believed to involve a current that flows through the substrate that melts or evaporates one or more of the deposited layers, appearing like a lightning strike beginning at the edge of the glass and burning inward toward the center of the glass. For the purposes of this disclosure a substrate can be a glass substrate, such as architectural glass, display technology glass (e.g., laptop and TV screens), or any other substrate upon which thin film coatings can be deposited. In a new recognition of the possible causes of crazing, it is believed that lightning arcs may occur when a parasitic current, not necessarily an electrostatic discharge or in addition to a discharge, flowing in the substrate and any coatings thereon exceeds the thermal capacity of the film, causing it to melt and evaporate. Substrate film currents are unintended and may occur due to potential differences between separate areas on the glass, unintended impedances to system ground, and film impedance. These currents may always be present to some degree and occur in or between sputtering zones, and even may occur in a single zone.

Figure 2:
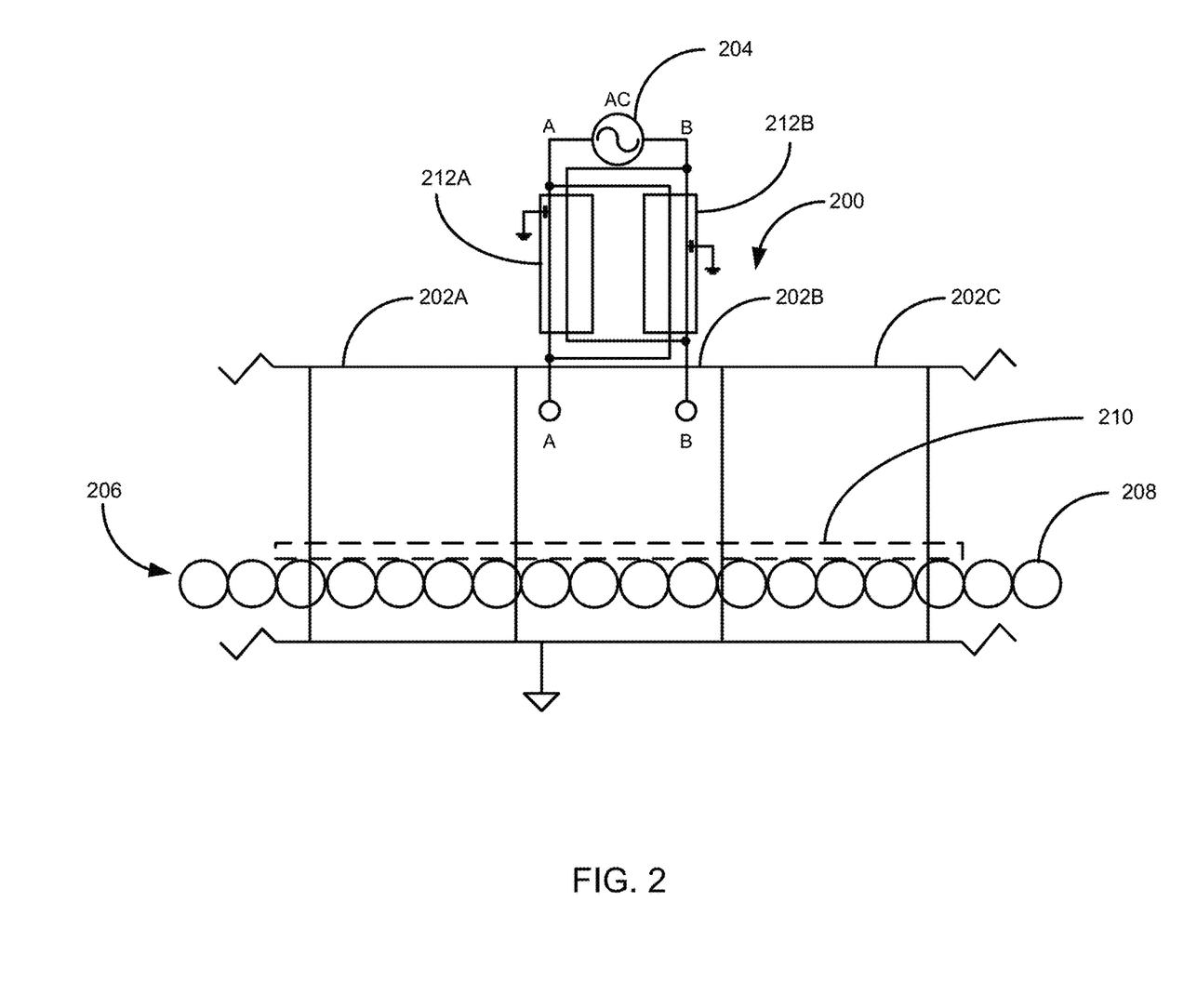
FIG. 2 is a block diagram of a portion of coating system with a low impedance shunt path between a power supply and one of the plasma chambers of the coating system, where the low impedance shunt path diverts parasitic AC currents that may otherwise causing crazing in coating of a substrate, according to aspects of the present disclosure.

FIG. 2 is a representative diagram of a substrate coating system 200 that includes several deposition chambers 202A-202C arranged in a processing line. The various deposition chambers are powered by various possible power supplies including a power supply 204, which although generally represented as an AC supply may provide a square wave, sine wave, other possible waveforms and alternating signal. The AC supply may be an AC or bipolar DC power source (such as the Crystal AC Power Supply and Ascent DMS manufactured by Advanced Energy Industries, Fort Collins, Co.). A coating system includes a conveyance system 206 providing a substrate support, such as conveyor rollers 208, that is arranged to move a substrate 210 from chamber to chamber to continuously deposit thin films, or conduct other operations of the various chambers, as the substrate 210 passes through each chamber. Often, some combination of chambers are depositing films at different locations on the substrate 508 at any given moment.

The power supply 204 can be coupled to two or more terminals A and B, which may also be referred to herein as electrodes or magnetrons of the chamber. Where two electrodes are used, as illustrated, the pair of electrodes can be an anodeless pair—meaning that each electrode plays the role of cathode and anode, depending on the AC cycle of the AC power supply. In an AC system, potential applied to each terminal alters between each terminal in accordance with the alternating signal generating and maintaining the plasma within the chamber. The electrodes can take any shape, form, and arrangement and such alternatives will not affect the outcome of this disclosure. For instance, the electrodes can be cylindrical or cubic, to name just two non-limiting examples. The electrodes can also be arranged and in contact with sides of the deposition chamber 202 in which they are positioned.

An aspect of the present disclosure involves use of a balanced triaxial connection between the power supply and chamber, which in the embodiment illustrated is provided by two grounded triaxial cables 212A, 212B connecting the power supply 204 to the respective electrodes A and B through a combined use of center and outer conductors of each cable. In one example, outer conductive shields of the respective triaxial cables are connected to system ground at the power supply and the chamber. The balanced connection takes advantage of inherent capacitance in the cables to provide an alternative low impedance path to ground for parasitic currents reducing the conditions that may cause defects such as crazing. Conventionally, the connections between the supply and chamber can be embodied in a single cable, such as a separate coaxial cable for each connection, a triaxial cable with discrete conductors between the power supply and the terminals of the deposition chamber, wires, leads or other forms of connections. It has been recognized that, when driven by an AC supply, the bias of the plasma may be modeled as a current source coupled to the glass substrate. It has been further recognized that the current pulses generated in the plasma will seek a path to ground, which parasitic current has been recognized to flow, at least to some extent, through the substrate (and coating thereon) in a conventional system. The use of the balanced triaxial cables provides an impedance path (capacitive) to ground that may reduce the parasitic current flows in the substrate and coating thereby reducing crazing.

Figure 2B:
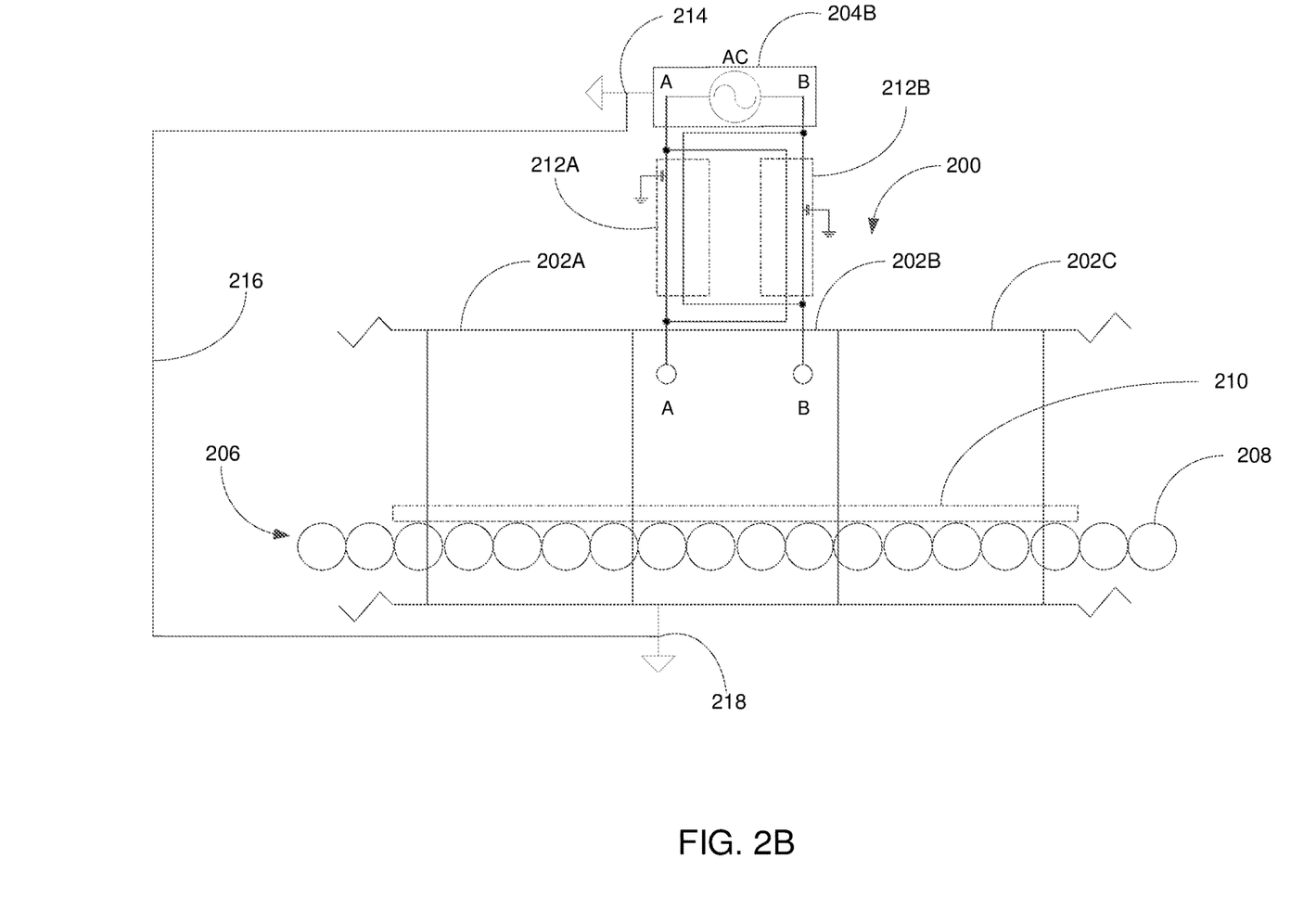
FIG. 2B is a block diagram of a portion of another coating system with a low impedance shunt path between a power supply and a plasma chamber of the coating system.

FIG. 2B is substantially the same as FIG. 2, except the power supply 204B of FIG. 2B includes a ground connection, ground point 214, coupled to a low impedance path 216. The low impedance path 216 is coupled between the ground connection of the power supply 204B, ground point 214, and the ground connection of the deposition chamber 202B, ground point 218. As discussed further herein (e.g., in reference to FIGS. 3 and 6), such a low impedance path between the power supply 204B and the deposition chamber 202B may be realized in a number of ways. For example, the low impedance path may be realized by a grounding strap (e.g., a copper strap) coupled between ground point 214 of the power supply 204B and ground point 218 of the deposition chamber 202B, in accordance with aspects discussed herein in reference to FIG. 6, and may similarly provide a return path for high frequency current from the deposition chamber 202B to the power supply 204B. As discussed further herein, such a grounding strap may provide a dedicated low impedance path (e.g., a return path) between a chamber and its power supply ground for the purpose of reducing crazing by the diversion of parasitic current, such as high frequency AC parasitic current, from the plasma in the chamber to the power supply and away from the substrate and any coatings thereon.

Figure 3:
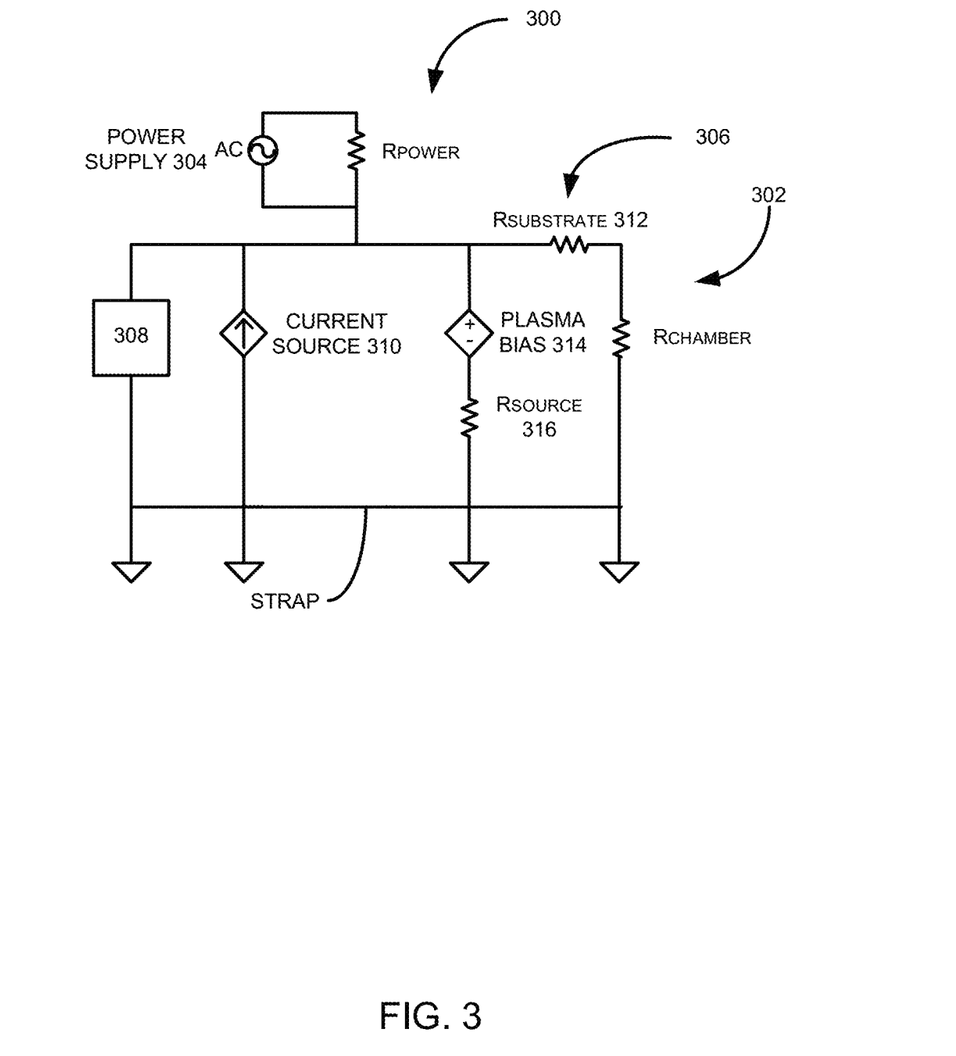
FIG. 3 is a model of a plasma chamber of a coating system, according to aspects of the present disclosure.

In one example, a system is proposed that provides a low impedance path for current pulses formed in the chamber to ground and not through the substrate. Through principles of current division, some current is diverted from the substrate reducing the conditions that cause crazing. To contextualize and explain the concepts and benefits of an alternative path to ground, FIG. 3 is a proposed model 300 of a chamber system 302, power supply 304, substrate 306 and related features, with an impedance element (e.g., as provided by the balanced capacitive coupling to ground through the pair of triaxial cables as discussed herein) in parallel with a current source 310 representing the current pulses from the AC powered plasma, which may be considered a parasitic current coupling to the substrate. The model further illustrates the bias presented by a plasma along with its resistance illustrated as a plasma bias 314 in series with a source impedance 316 ($R_{SOURCE}$). During coating, the plasma is in contact with the substrate and hence the plasma bias creates a source of current through the substrate. In a conventional system, the current would find a path through the substrate, represented by $R_{SUBSTRATE}$ 312, to ground.

The effect would be to create conditions where crazing may occur. In reference to the model, while likely high impedances, there are nonetheless paths to ground through the chamber impedance of the existing chamber ($R_{CHAM-}$ BER) as well as possibly through other chambers, through the rollers, and the like (although not shown in the model). It is believed that unintended parasitic currents through the coating or film on a substrate may exceed a films thermal threshold and trigger a crazing event (melting and evaporating the film in a lighting like pattern). Crazing may continue to etch paths in the film until the potential is reduced and the crazing event extinguishes. As discussed herein, various solutions are proposed that divert such parasitic currents to avoid parasitic levels that may initiate crazing.

In one example, some of the unintended parasitic currents may instead find a path to ground through the impedance element 308 bypassing the substrate and thereby reducing the conditions that may cause crazing. In one particular embodiment, an impedance connection, which may be provided through balanced capacitors to ground from each plasma terminal of a given chamber, is provided that provides an alternative path, away from the substrate, for some of such parasitic currents to flow to ground. In a more particular form, the connection between the power supply and the chamber terminals in the form of a balanced triaxial cable arrangement where inherent capacitances of the cable, in the balanced connection, provide a path to ground for the AC parasitic current pulses of the chamber thereby causing some of the current to bypass the substrate.

Figure 4A:
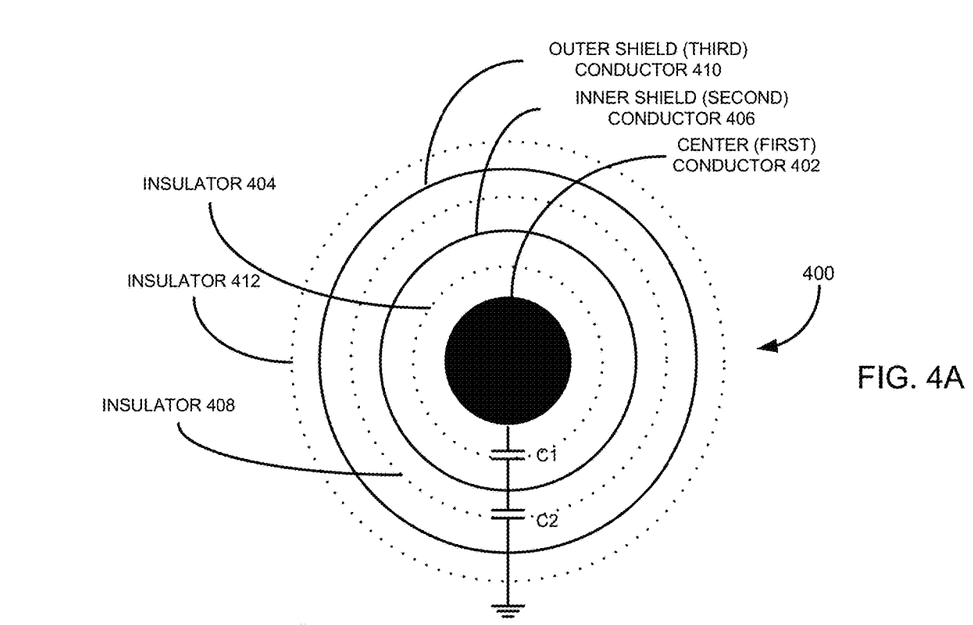
FIG. 4A is a section view of a triaxial cable.

FIG. 4A is a section view of a triaxial cable 400, a pair of which may be used to provide a balanced triaxial connection as discussed herein. The triaxial cable 400 includes a center conductor 402 surrounded by a first insulator 404, which is surrounded by a first conductive shield (second conductor) 406, which is surrounded by a second insulator 408 with an outer conductive shield (third conductor) 410 and outer (third) insulator 412. The triaxial cable, by nature of its structure, may form capacitors. More particularly, the combination of the center conductor 402, the first insulator 404 and the inner conductive shield 406 forms a first capacitor (C1), and the combination of the first inner conductive shield 406, the second insulator 408 and the outer conductive shield 410 form a second capacitor (C2).

Figure 4B:
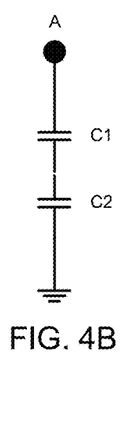
FIG. 4B is an electrical schematic representation of the capacitive coupling between a center conductor and ground of the triaxial cable of FIG. 4.
Figure 4C:
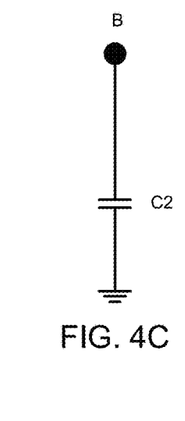
FIG. 4C is an electrical schematic representation of the capacitive coupling between a inner shield conductor and ground of the triaxial cable of FIG. 4.

In some convention configurations, a single conventional trixial cable is used to couple a power supply to the terminals of a chamber. FIGS. 4B and 4C illustrate the unbalanced nature of a conventional arrangement where one terminal of a chamber (e.g. A) would be connected to the power supply 204 with the center conductor 402 (FIG. 4B) and another terminal of the chamber (e.g., B) is connected to the power supply with the first, inner, conductive shield 406 (FIG. 4C). Referring to FIG. 4B, it can be seen that the conductor 402 (for terminal A) provides a path to ground through both capacitors C1 and C2 whereas the conductor 406 (for terminal B) is connected to ground through C2 in an unbalanced way—one path has two capacitors and the other path has a single capacitor. Although illustrated as two capacitors C1 and C2 in series (FIG. 4B) in a path between the center conductor and ground, the inner shield 406 effectively shields the center conductor to ground, which does not effectively allow the capacitor to ground the center conductor. Hence, in the unbalanced conventional connection, the center conductor 402 does not have a low impedance path to ground particularly for some high frequency parasitic currents experienced in a plasma coating system.

Figure 4D:
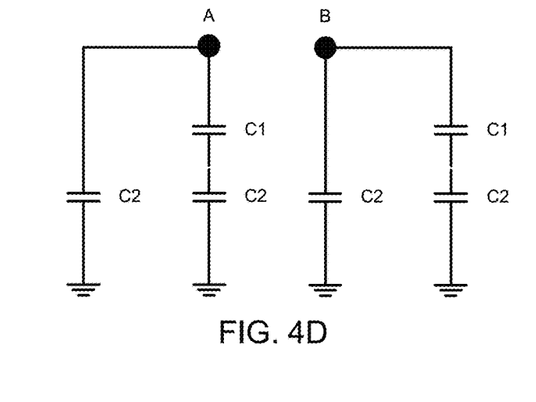
FIG. 4D is an electrical schematic representation of a balanced capacitive coupling between terminals of a plasma chamber through the use of a pair of triaxial cables with one terminal of the plasma chamber having a center conductor connection to the power supply with one triaxial cable and the terminal also having an inner shield conductor connection to the power supply with another triaxial cable, and the other terminal having a mirror of the connections with the same pair of cables such that balanced connections are provided for each terminal in contrast to what is shown in FIGS. 4A and 4B, according to aspects of the present disclosure.
Figure 5:
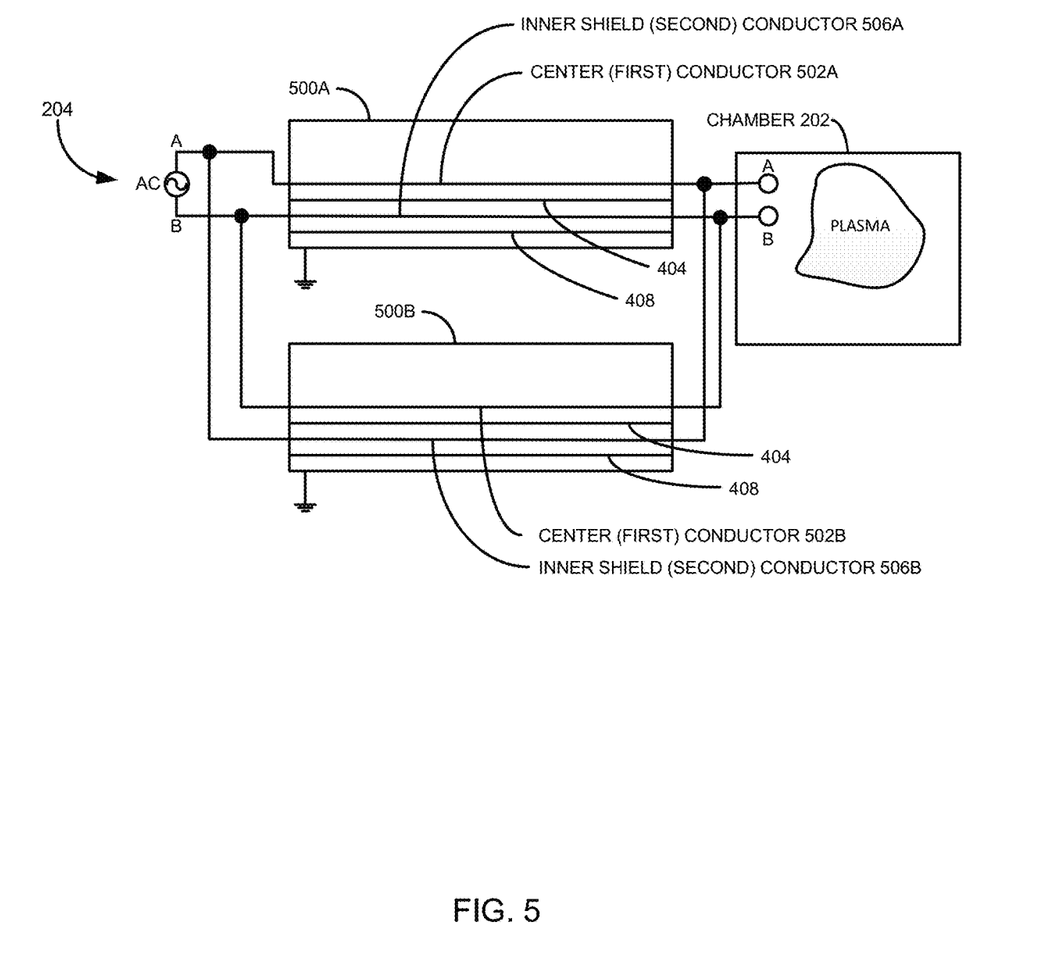
FIG. 5 is a diagram depicting a power supply coupled with a chamber of a coating system, with the power supply being coupled using the balanced triaxial cable connections represented by FIG. 4C, according to aspects of the present disclosure.

FIG. 4D is a representation of a balanced triaxial connection that may be provided by using two triaxial cables for each connection between the power supply 204 and the terminals (A) and (B) of the chamber 202. In this arrangement, it can be seen that both the connections between the A and B side each have a connection between an inner shield and ground and hence both have a low impedance path to ground for high frequency currents. FIG. 5 is another diagram illustrating a balanced, dual triaxial cable, connection between the power supply and the terminals (A) and (B) of the deposition chamber. Each triaxial cable 500A, 500B illustrated in FIG. 5 has the cross section illustrated in FIG. 4A. To achieve a balanced, AC current shunt, the two triaxial cables 500A, 500B are used to connect the power supply 204 to the two terminals A and B of the chamber. In the first cable 500A, terminal A is connected to power supply 204 at side (A) via the center conductor 502A and terminal B is connected to the power supply side (B) with the first inner shield conductor 506A. In the second cable 500B, terminal A is connected to the power supply side (B) via the center conductor 502B and terminal B is connected to the power supply side (A) with the first inner shield conductor 506B. This connection provides the balanced arrangement depicted in FIG. 4D.

In more detail, through the combined use of triaxial cables, in a first cable there is one center conductor path from one side of the power supply (e.g., A) to one of the terminals (e.g., A) (a first A connection) and there is one shield conductor path from the other side (e.g. B) of the power supply to the other terminal (e.g., B) (a first B connection). With the first cable, there are two capacitors to ground in the first connection between the A side and the A terminal and one capacitor to ground in the second connection between the B side and the B terminal. In a second cable, balance is achieved in the A side connection by providing a second A connection between the A side of the power supply and the A terminal through the inner shield conductor with one capacitor to ground, and in the B side connection by providing a second B connection between the B side of the power supply and the B terminal through the center conductor connection with two capacitors to ground. Thus, in the connection between the A side and the A terminal, there is one path with two capacitors to ground in a first triaxial cable and a parallel path with one capacitor to ground in the other, second, triaxial cable. In the connection between the B side and the B terminal, there is one path with two capacitors to ground in the second triaxial cable and another path with one capacitor to ground in the first triaxial cable. Thus, the connections between each side of the power supply and the respective terminal have the same (balanced) paths provided by parallel connections of each path with the same capacitive connections to ground provided by the combined parallel connections of each path. Moreover, each of the A and B connections has a low impedance path for high frequency parasitic current provided by the inner shield and the capacitive coupling to ground represented by C2 in FIG. 4D.

Figure 6:
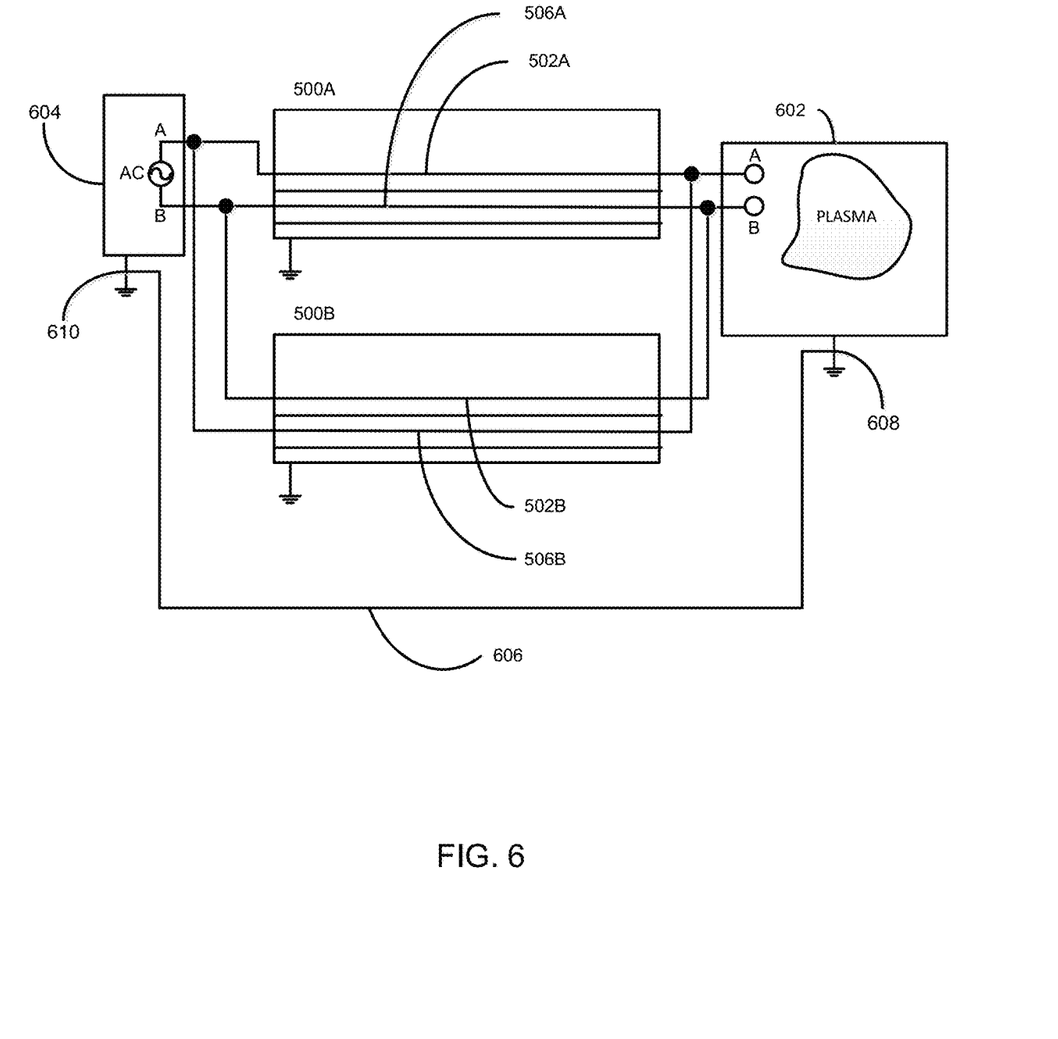
FIG. 6 is a diagram depicting a power supply coupled with a chamber of a coating system, and with a low impedance path connected between a ground point of the chamber and a ground point of the power supply, according to aspects of the present disclosure.

FIG. 6 illustrates a chamber 602, which may be one chamber among many of a coating system, with an AC ground directly to its power supply 604. The system provides a low impedance path between the chamber and power supply. The low impedance return path may be provided with the power supply being mounted directly on the chamber or through a dedicated low impedance frame or other member interconnected the chamber and supply. In one example, a copper strap 606 is connected between a ground point 608 of the plasma chamber and a grounding point 610 of the associated power supply 604. The strap provides a dedicated low impedance path between a chamber and its power supply ground for the purpose of reducing crazing by the diversion of parasitic current from the plasma in the chamber away from the substrate and any coatings thereon.

While a copper strap is provided in one example, other low impedance connections between the supply ground and the chamber ground are possible. Further, in FIG. 6, a balanced triaxial coupling between the power supply and magnetrons is illustrated, with the AC return path between the chamber and supply ground further reducing the likelihood of crazing. However, the AC return path may be used without the balanced triaxial approach or other shunt impedance approaches.

The AC ground between the chamber and the power supply provides a dedicated return path for high frequency AC parasitic current from the plasma within the chamber to the power supply. Referring back to the model depicted in FIG. 3, the AC ground return path is provided by the copper strap interconnection between the shunting impedance element 308, current source 310 (modeling the plasma as a current source), plasma bias 314 and associated source impedance 316, and the chamber impedance ($R_{CHAMBER}$). The strap provides a dedicated low impedance path for any AC supply induced parasitic current away from the substrate and to supply ground.

Another aspect of the present disclosure recognizes that potential differences may be induced between chambers resulting in parasitic current flows across the coatings and between the potential differences. As generally shown in FIG. 2, a substrate coating system 200 or processing line typically includes many plasma deposition chambers (e.g., 202A-202C), each configured to deposit either an insulator or a conductor. A substrate 210, such as a slab of architectural glass, is shown in the system. The substrate may be sized such that it spans multiple plasma deposition chambers and therefore may see deposition of different layers simultaneously. Conventional glass coating systems that include a sequence of plasma deposition chambers that a substrate moves between to be coated or otherwise processed at each chamber are not synchronized with respect to the power supply and energy provided to each deposition chamber. Stated differently, while the deposition chambers are part of an overall system to coat or otherwise process a substrate moving between the chambers, the power driving each chamber and the process of the given chamber is not synchronized or controlled relative to the other chambers.

Within a discrete chamber, the power supply generates a differential voltage between magnetrons (terminals) to initiate and sustain a plasma as part of the coating process. Conventionally, the plasma process in one chamber may generate a bias on the substrate that is different from the bias form a process in an adjacent chamber. Accordingly, another aspect of the present disclosure involves the recognition that a current path may form between adjacent chambers due to potential differences between chambers from the differential voltages being applied in such adjacent chambers. The current path between chambers may include the substrate and whatever coatings are on the substrate as the substrate is being processed simultaneously in adjacent chambers.

Figure 7A:
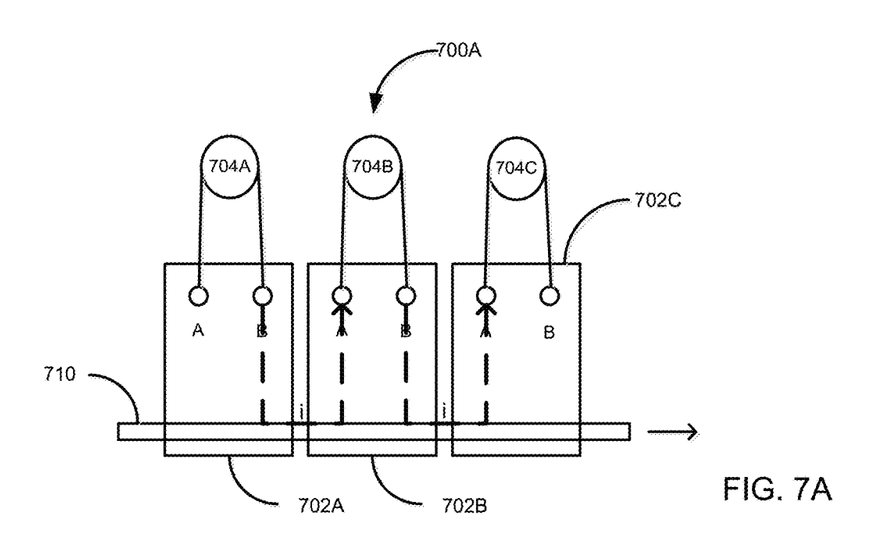
FIG. 7A is a diagram depicting parasitic currents that may flow between chambers of a coating system when AC signals to each chamber are unsynchronized resulting in possible potential differences between chambers.

FIG. 7A is a diagram depicting a deposition system 700 with a conventional arrangement of three adjacent chambers (702A, 702B, and 702C) and a substrate 710 being moved from chamber to chamber on a conveyance system (see, e.g., FIG. 2, rollers 206). Each chamber has respective AC power supplies 704A, 704B, and 704A powering respective magnetrons A and B of each chamber to ignite and sustain plasmas in each chamber. Three chambers are shown merely for illustration and a system may have more such chambers. The substrate may be processed simultaneously in the various adjacent chambers as the substrate is conveyed from chamber to chamber. In a conventional system as shown in FIG. 7A, the magnetrons A and B of each chamber are typically the same resulting in B magnetrons being immediately adjacent A magnetrons as shown.

Without controlling the AC power signal in each chamber and/or without altering the magnetron arrangement, it is possible and indeed likely that potential differences will occur between chambers. Under a scheme where the A magnetron receives a positive portion of the duty cycle and the B magnetron receives a negative portion of the duty cycle for each chamber, it can be seen that the terminal (labeled B) in the chamber 702A may receive a negative voltage signal whilst the adjacent terminal (labeled A) in the adjacent chamber 702B may receive a positive voltage. For the sake of discussion, if each signal is the same and the positive voltage is +500V and the negative voltage is −500V, a potential difference of 100 volts may be created between the terminals of the adjacent chambers. Such a potential difference may cause current to flow through a substrate (and whatever coating may be applied to the substrate) between the two adjacent chambers. The current may initiate crazing in the coatings.

Figure 7B:
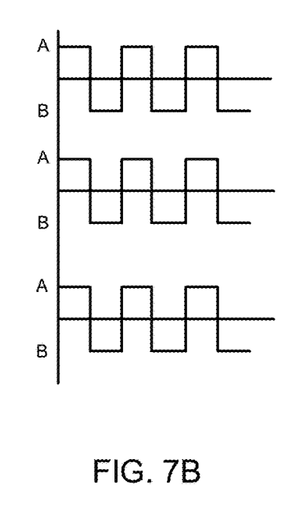
FIG. 7B is a diagram depicting balanced AC signal waveforms to each plasma chambers, according to aspects of the present disclosure.
Figure 7C:
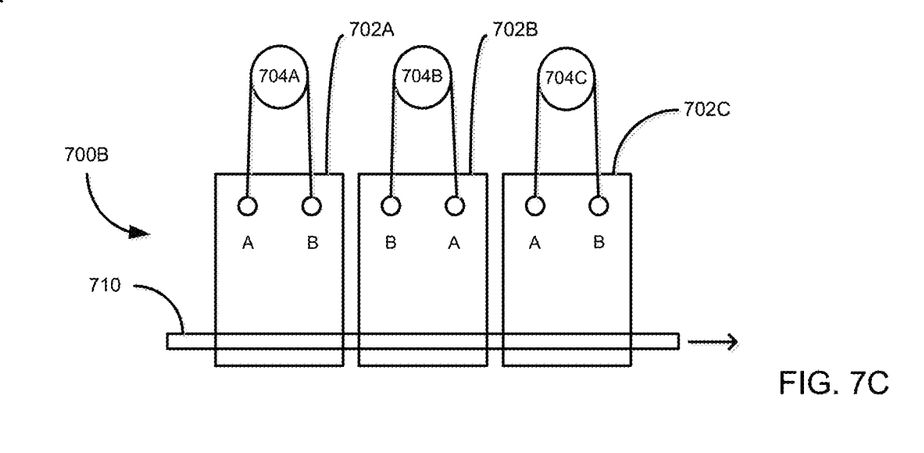
FIG. 7C is a diagram depicting AC signal polarity synchronization between chambers, according to aspects of the present disclosure.

To reduce or eliminate current paths between chambers and across a coated substrate that may cause crazing, aspects of the present disclosure involve the synchronization of the power signals between adjacent signals (e.g., as shown in FIG. 7A) such that potential differences between adjacent terminals of adjacent chambers are minimized or eliminated, and, alone or in combination with synchronization of the power signals, the physical arrangement of terminals or adjacent chambers such that adjacent terminals of adjacent chambers receive power signals of the same polarity (e.g., as shown in FIG. 7C), which may also be of the same or substantially the same voltage.

FIG. 7B illustrates AC signals that may be applied from a respective three power supplies coupled with a pair of terminals of each chamber. These signals are illustrated in a synchronized form (e.g., the three signals depict the same square wave pattern with a 50% duty cycle). With respect to signal synchronization, a controller of each power supply or a controller operably coupled with an controlling multiple power supplies, may be configured to control a process in any given deposition chamber in synchronization with a process in an adjacent chamber to minimize potential differences between adjacent magnetrons of adjacent chambers. In a simple example for illustration purposes, consider the signals illustrated in FIG. 7B being applied to the chambers of FIG. 7C. When the first and second signals applied to the first and second chamber are each low, then magnetrons B of each chamber will be synchronized to be low at the same time. Hence, adjacent terminals of adjacent chambers have the same polarity. This may be achieved through signal control and/or through the connections between the respective supplies and terminals of a chamber. Returning to the example introduce above with AC pattern between +500 volts and −500 volts, −500 volts is applied to B of chamber 702A at the same time −500 volts is applied to B of chamber 702B. Since the values are the same and both negative, then there will be no potential difference in the area immediately between the chambers. Even if waveforms with different voltage levels are used for each chamber, since the polarity of the signals is the same at the adjacent terminals, the potential difference will be less than a case where one signal is positive and the other negative at adjacent terminals. When the second and third signals applied to the second and third chambers, respectively, are each high, then magnetrons A of each chamber will be synchronized to be high at the same time. While illustrated in the context of a rearrangement of the electrode A and electrode B of each chamber for A adjacencies and B adjacencies (e.g., anode adjacency and cathode adjacency between chambers), synchronization may also be managed in a conventional chamber arrangement to coordinate the signals to minimize the potential differences between magnetrons of adjacent chambers. While processes and hence signals to each chamber may differ, it is nonetheless possible to synchronize such signals to minimize potential differences between adjacent (terminals) magnetrons of adjacent chambers.

Many times, the AC signal controlling the process in any given chamber may be the same or similar with only differences in voltage levels. In such instances, particularly with the same type of signal having the same duty cycle, polarity to each chamber may be controlled with the adjacent terminals of adjacent chambers having the same polarity. In other instances, differences in frequency or type of signal may make coordination of signals more complicated. Nonetheless, it is still possible to control the signals so that there is some overlap in signal polarity between adjacent chambers or to otherwise coordinate the signals such that potential differences are minimized wherever possible.

Figure 8:
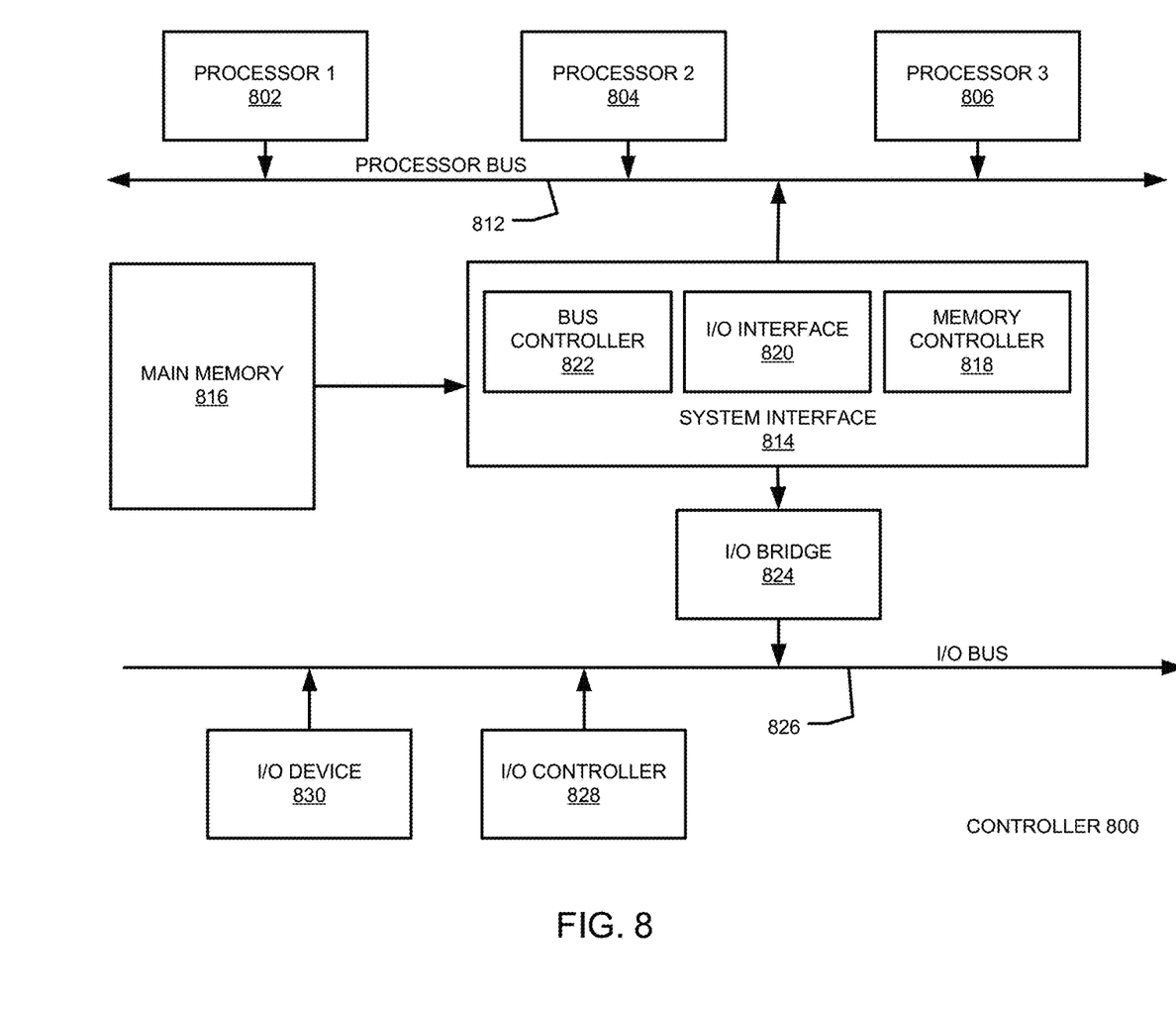
FIG. 8 is a diagram depicting a computer system, which may be used to implement a control system or controller of a power system or be integral with the same, to implement various methods according to aspects of the present disclosure.

FIG. 8 is a block diagram illustrating an example of a computing device or computer system 800 which may be used in implementing the controller, for example. The controller may also be integrated with an RF power supply, or other form of supply, integrated in an impedance matching network, or otherwise be provided in various possible forms. Referring to the example of FIG. 8, the computing system 800 may be a control device for providing any controlling signal to any of the switching devices for the driver circuits discussed above. The computer system (system) includes one or more processors 802-806. Processors 802-806 may include one or more internal levels of cache (not shown) and a bus controller or bus interface unit to direct interaction with the processor bus 812. Processor bus 812, also known as the host bus or the front side bus, may be used to couple the processors 802-806 with the system interface 814. System interface 814 may be connected to the processor bus 812 to interface other components of the system 800 with the processor bus 812. For example, system interface 814 may include a memory controller 818 for interfacing a main memory 816 with the processor bus 812. The main memory 816 typically includes one or more memory cards and a control circuit (not shown). System interface 814 may also include an input/output (I/O) interface 820 to interface one or more I/O bridges or I/O devices with the processor bus 812. One or more I/O controllers and/or I/O devices may be connected with the I/O bus 826, such as I/O controller 828 and I/O device 830, as illustrated. The system interface 814 may further include a bus controller 822 to interact with processor bus 812 and/or I/O bus 826.

I/O device 830 may also include an input device (not shown), such as an alphanumeric input device, including alphanumeric and other keys for communicating information and/or command selections to the processors 802-806. Another type of user input device includes cursor control, such as a mouse, a trackball, or cursor direction keys for communicating direction information and command selections to the processors 802-806 and for controlling cursor movement on the display device.

System 800 may include a dynamic storage device, referred to as main memory 816, or a random access memory (RAM) or other computer-readable devices coupled to the processor bus 812 for storing information and instructions to be executed by the processors 802-806. Main memory 816 also may be used for storing temporary variables or other intermediate information during execution of instructions by the processors 802-806. System 800 may include a read only memory (ROM) and/or other static storage device coupled to the processor bus 812 for storing static information and instructions for the processors 802-806. The system set forth in FIG. 8 is but one possible example of a computer system that may employ or be configured in accordance with aspects of the present disclosure.

According to one embodiment, the above techniques may be performed by computer system 800 in response to processor 804 executing one or more sequences of one or more instructions contained in main memory 816. These instructions may be read into main memory 816 from another machine-readable medium, such as a storage device. Execution of the sequences of instructions contained in main memory 816 may cause processors 802-806 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 816. Common forms of machine-readable medium may include, but is not limited to, magnetic storage medium; optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

Embodiments of the present disclosure include various steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

The description above includes example systems, methods, techniques, instruction sequences, and/or computer program products that embody techniques of the present disclosure. However, it is understood that the described disclosure may be practiced without these specific details. In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages should be understood by the foregoing description, and it should be apparent that various changes may be made in the form, construction and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it should be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

We claim:

1. A plasma deposition system comprising:
   an alternating current power supply including a first output and a second output;
   a first triaxial cable that is grounded, the first triaxial cable comprising a first center conductor and a first conductive shield;
   a second triaxial cable that is grounded, the second triaxial cable comprising a second center conductor and a second conductive shield;
   a plasma deposition chamber having a first terminal and a second terminal;
   the first output coupled with the first center conductor and the second output coupled with the first conductive shield, the first output coupled with the second conductive shield and the second output coupled with the second center conductor;
   the first center conductor coupled with the first terminal and the second conductive shield coupled with the first terminal; and
   the first conductive shield coupled with the second terminal and the second center conductor coupled with the second terminal.

2. The deposition system of claim 1 wherein the first triaxial cable further comprises a first outer conductive shield that is grounded at the alternating current power supply and the deposition chamber, the second triaxial cable further comprises a second outer conductive shield that is grounded at the alternating current power supply and the deposition chamber.

3. The deposition system of claim 2 wherein the deposition system is a glass coating system, and the first triaxial cable and the second triaxial cable provide capacitive or low impedance paths to ground for parasitic current otherwise causing defects on a substrate being processed in the glass coating system.

4. The deposition system of claim 1 wherein the power supply includes a first ground connection and the deposition chamber includes a second ground connection, the system further comprising a low impedance return path coupled between the first ground connection and the second ground connection.

5. The deposition system of claim 4 wherein the low impedance return path is a grounding strap that provides the low impedance return path for high frequency current from the chamber.

6. The deposition system of claim 1 further comprising:
   a second deposition chamber including a third terminal and a fourth terminal;
   a second power supply coupled with the third terminal and the fourth terminal; and
   a conveyor system that moves a substrate between the deposition chamber and the second deposition chamber, the deposition chamber positioned adjacent to the second deposition chamber, and wherein the alternating current power supply providing a first alternating current signal to the first terminal and the second terminal is coordinated with the second power supply providing a second alternating current signal to the third terminal and the fourth terminal, the coordination to minimize a potential difference between at least the second terminal of the deposition chamber and the third terminal of the second deposition chamber.

7. The deposition system of claim 6 wherein the second terminal of the first deposition chamber is adjacent the third terminal of the second deposition chamber.

8. The deposition system of claim 7 wherein the deposition chamber is being operated to deposit material on the substrate at a same time as the second deposition chamber, the coordination of the alternating current power supply and the second power supply includes managing the first alternating current signal and the second alternating current signal to have a same polarity at the second terminal and the third terminal at a same time.

9. The deposition system of claim 6 wherein the deposition system is operated to minimize frequency transitions imposed on the substrate between the deposition chamber and the second deposition chamber.

10. The deposition system of claim 1 wherein the deposition system is operated to synchronize transitions between the first deposition chamber and the second deposition chamber.

11. The deposition system of claim 1 further comprising:
    a second deposition chamber including a third terminal and a fourth terminal coupled with a second power supply, the second deposition chamber positioned adjacent to the deposition chamber and including a conveyance system for moving a substrate between the deposition chamber and the second deposition chamber to process the substrate;
    wherein the second terminal of the deposition chamber is proximate the third terminal of the second deposition chamber, and wherein the alternating current power supply is configured to provide an AC power signal to the second terminal synchronized with the second power supply providing a second AC power signal to the third terminal so that a first polarity of the first AC signal at the second terminal is a same as a second polarity of the second AC signal at the third terminal at a same time.

12. The deposition system of claim 11 wherein the second terminal and the third terminal each include a magnetron of a same type.

13. The deposition system of claim 11, including a controller to control both the power supply and the second power supply so the first polarity of the first AC signal at the second terminal is a same as a second polarity of the second AC signal at the third terminal at a same time.

14. The deposition system of claim 1 further comprising:
    the first triaxial cable comprises a first capacitor formed by the first center conductor and the first conductive shield and a first insulator therebetween, and a second capacitor formed by the first conductive shield and a first outer shield and a second insulator therebetween; and the second triaxial cable comprises a third capacitor formed by the second center conductor and the second conductive shield and a third insulator therebetween, and a fourth capacitor formed by the second conductive shield and a second outer shield and a fourth insulator therebetween.

15. The deposition system of claim 14 wherein the first triaxial cable and the second triaxial cable have a same impedance to provide a balanced shunt path to ground.

16. The deposition system of claim 1 wherein:
in a first connection between the first output and the first terminal, there is one path with two capacitors to ground in the first triaxial cable and another path with one capacitor to ground in the second triaxial cable; and
in a second connection between the second output and the second terminal, there is one path with two capacitors to ground in the second triaxial cable and another path with one capacitor to ground in the first triaxial cable.

17. The deposition system of claim 16 wherein:
the first connection and the second connection comprise parallel connections with a same capacitance to ground.

18. The deposition system of claim 16 wherein:
the first connection and the second connection each comprise a low impedance path for high frequency parasitic current.

19. The deposition system of claim 18 further comprising:
a low impedance path coupled between the deposition chamber and a ground of the power supply, the low impedance path providing a dedicated electrical path that diverts parasitic current generated by the powered plasma away from a path that is through the substrate to ground, thereby reducing crazing caused by parasitic current flowing through the substrate.

20. The deposition system of claim 1 wherein the alternating current power supply applies potential to the first terminal and the second terminal to generate powered plasma within the deposition chamber for processing a substrate.

* * * * *